(12) United States Patent
Shim et al.

(10) Patent No.: US 12,101,970 B2
(45) Date of Patent: Sep. 24, 2024

(54) LIGHT EMITTING DISPLAY DEVICE HAVING REPAIR STRUCTURE

(71) Applicant: LG DISPLAY CO., LTD., Seoul (KR)

(72) Inventors: Sungbin Shim, Paju-si (KR); Sungbai Lee, Paju-si (KR); MoonSoo Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 449 days.

(21) Appl. No.: 17/519,325

(22) Filed: Nov. 4, 2021

(65) Prior Publication Data

US 2022/0149128 A1 May 12, 2022

(30) Foreign Application Priority Data

Nov. 9, 2020 (KR) ........................ 10-2020-0148887

(51) Int. Cl.
| | | |
|---|---|---|
| *H10K 59/123* | (2023.01) | |
| *H10K 59/122* | (2023.01) | |
| *H10K 59/124* | (2023.01) | |
| *H10K 71/00* | (2023.01) | |
| *H10K 102/00* | (2023.01) | |

(52) U.S. Cl.
CPC ......... *H10K 59/123* (2023.02); *H10K 59/122* (2023.02); *H10K 59/124* (2023.02); *H10K 71/00* (2023.02); *H10K 71/831* (2023.02); *H10K 2102/341* (2023.02)

(58) Field of Classification Search
CPC .. H10K 59/123; H10K 59/122; H10K 59/124; H10K 2102/341
USPC ............................................................ 257/40
See application file for complete search history.

(56) References Cited

U.S. PATENT DOCUMENTS

| | | | |
|---|---|---|---|
| 8,054,395 B2 | 11/2011 | Lim et al. | |
| 9,754,538 B2 | 9/2017 | Lee et al. | |
| 11,257,886 B2 * | 2/2022 | Bae | .............. H10K 59/1213 |
| 2021/0202655 A1 * | 7/2021 | Cho | .................. H10K 50/824 |
| 2021/0273145 A1 * | 9/2021 | Lee | .................. H01L 33/382 |
| 2023/0207735 A1 * | 6/2023 | Choi | ................. H01L 33/382 |
| | | | 257/79 |

FOREIGN PATENT DOCUMENTS

| | | |
|---|---|---|
| KR | 10-1048927 B1 | 7/2011 |
| KR | 10-2016-0007875 A | 1/2016 |
| KR | 10-2016-0017868 A | 2/2016 |

* cited by examiner

*Primary Examiner* — Xia L Cross
(74) *Attorney, Agent, or Firm* — POLSINELLI PC

(57) ABSTRACT

A light emitting display device includes a light emitting element including a pixel electrode, a common electrode, and a light emitting layer interposed between the pixel electrode and the common electrode, and a pixel circuit electrically connected to the pixel electrode of the light emitting element, wherein the pixel electrode may include a first pixel electrode portion, a second pixel electrode portion spaced apart from the first pixel electrode portion, a circuit contact portion connected to the pixel circuit, a first electrode connection portion connected or disconnected between the first pixel electrode portion and the circuit contact portion, and a second electrode connection portion connected or disconnected between the second pixel electrode portion and the circuit contact portion.

20 Claims, 11 Drawing Sheets

LIGHT EMITTING DISPLAY DEVICE HAVING REPAIR STRUCTURE

CROSS-REFERENCE TO RELATED APPLICATION

This application claims the benefit of the Korean Patent Application No. 10-2020-0148887 filed on Nov. 9, 2020, which is hereby incorporated by reference in its entirety as if fully set forth herein.

BACKGROUND

Field of the Disclosure

The present disclosure relates to a light emitting display device and an electronic apparatus including the same

Description of the Background

With the advancement of the information age, the demand for a display device for displaying an image has increased with various forms.

Among such display devices, a light emitting display device is classified into an inorganic light emitting display device and an organic light emitting display device depending on a material of a light emitting layer. For example, the organic light emitting display device is a self-luminance display device which injects holes from an anode electrode and electrons from a cathode electrode into a light emitting layer and emits light when an exciton generated by combination of the injected holes and electrons falls from an excited state to a ground state.

The organic light emitting display device is manufactured by a manufacturing process of forming a thin film transistor (TFT) and a manufacturing process of forming a light emitting element on the thin film transistor.

The manufacturing process of forming the light emitting element may cause a short due to particles generated between an anode electrode and a cathode electrode, thereby causing a dark defect.

SUMMARY

Accordingly, the present disclosure is to resolve the problem of the background art in a top emission display device. For example, the top emission display device needs to make sure of transmittance of the cathode electrode positioned on an upper layer in the light emitting element. Thus, the cathode electrode is formed by sputtering of a transparent conductive material. In this case, particles may remain on the anode electrode, and the cathode electrode is deposited between air gaps caused by the particles, whereby a short between the anode electrode and the cathode electrode occurs remarkably.

To solve this, the present disclosure provides a light emitting display device of a new structure that may repair a defect caused by a short by applying a constant voltage to the light emitting display device such as the top emission display device in accordance with an aging process.

The present disclosure has been made in view of the above problems, and the present disclosure is to provide a light emitting display device having a repair structure for a short defect between an anode electrode and a cathode electrode.

In addition, the present disclosure as mentioned above, additional of the present disclosure will be clearly understood by those skilled in the art from the following description of the present disclosure.

In accordance with an aspect of the present disclosure, the above and other features can be accomplished by the provision of a light emitting display device comprising a light emitting element including a pixel electrode, a common electrode, and a light emitting layer interposed between the pixel electrode and the common electrode, and a pixel circuit electrically connected to the pixel electrode of the light emitting element, wherein the pixel electrode may include a first pixel electrode portion, a second pixel electrode portion spaced apart from the first pixel electrode portion, a circuit contact portion connected to the pixel circuit, a first electrode connection portion connected or disconnected between the first pixel electrode portion and the circuit contact portion, and a second electrode connection portion connected or disconnected between the second pixel electrode portion and the circuit contact portion.

In accordance with another of the present disclosure, there is provided an electronic apparatus including the above light emitting display device.

BRIEF DESCRIPTION OF THE DRAWINGS

The above and other features and advantages of the present disclosure will be more clearly understood from the following detailed description taken in conjunction with the accompanying drawings, in which.

DETAILED DESCRIPTION

Figure 1:
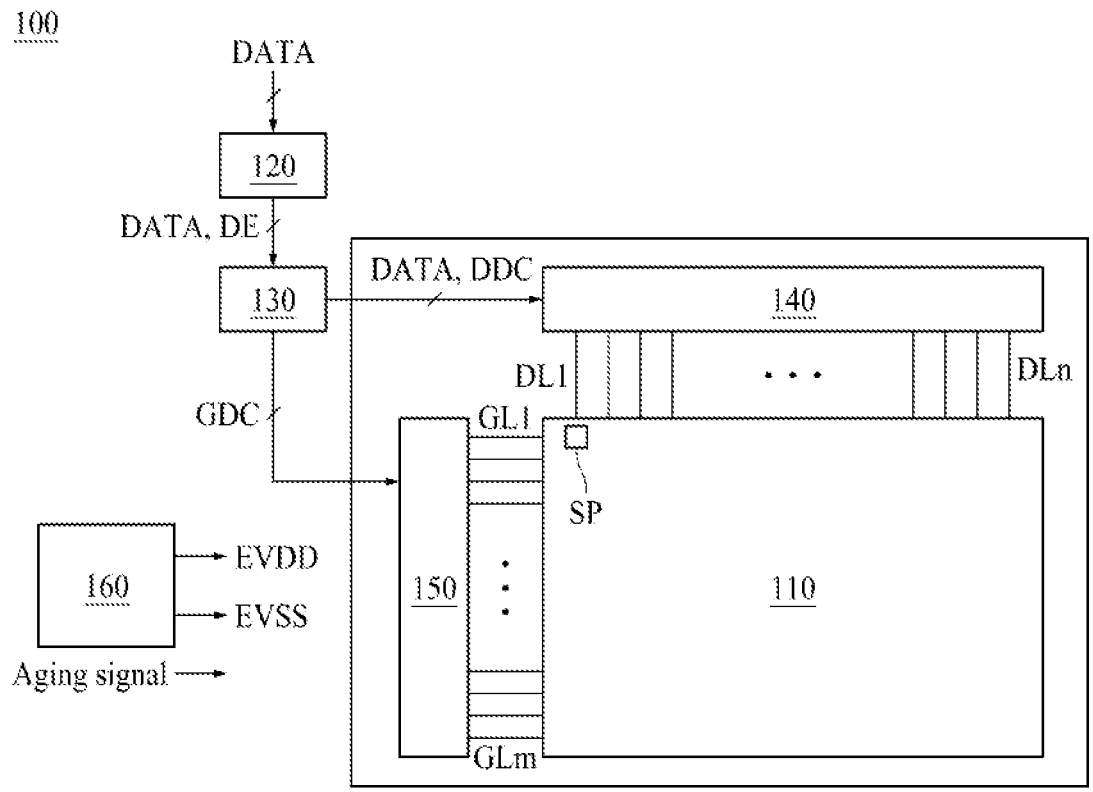
FIG. 1 is a schematic block view illustrating a light emitting display device according to the aspect of the present disclosure.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing aspects of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

In describing a temporal relationship, for example, when the temporal order is described as 'after~', 'subsequent~', 'next~', and 'before~', a case which is not continuous may be included unless 'just' or 'direct' is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The terms "first horizontal axis direction," "second horizontal axis direction," and "vertical axis direction" should not be interpreted only based on a geometrical relationship in which the respective directions are perpendicular to each other, and may be meant as directions having wider directivities within the range within which the elements of the present disclosure can operate functionally.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

Hereinafter, aspects of a light emitting display device according to the present disclosure will be described in detail with reference to the accompanying drawings. Wherever possible, the same reference numbers will be used throughout the drawings to refer to the same or like parts. Since a scale of each of elements shown in the accompanying drawings is different from an actual scale for convenience of description, the present disclosure is not limited to the shown scale.

FIG. 1 is a schematic block view illustrating a light emitting display device according to the aspect of the present disclosure.

Referring to FIG. 1, a light emitting display device 100 according to the aspect of the present disclosure may include a display panel 110, an image processor 120, a timing controller 130, a data driver 140, a scan driver 150, and a power supply 160.

The display panel 110 may display an image in response to a data signal DATA supplied from the data driver 140, a scan signal supplied from the scan driver 150, and a power source supplied from the power supply 160. The display panel 110 may include subpixels SP that operate to display an image.

The subpixels SP may be formed in a top emission method, a bottom emission method, or a dual emission method in accordance with a structure. The subpixels SP may include a red subpixel, a green subpixel and a blue subpixel, or may include a red subpixel, a blue subpixel, a white subpixel and a green subpixel. The subpixels SP may have one or more different light emission areas in accordance with light emission characteristics. One or more subpixels SP may constitute one unit pixel. For example, one unit pixel may include red, green, blue and white subpixels, and red, green, blue and white subpixels may repeatedly be disposed, or red, green, blue and white subpixels may be disposed in a quad type. For example, in a quad-type arrangement, blue and red subpixels may be disposed in a first scan line, and green and white subpixels may be disposed in a second scan line. However, without limitation to this example, in the aspect according to the present disclosure, a color type, an arrangement type, an arrangement order, etc. of the subpixels may be configured in various forms depending on the light emission characteristics, lifespan of an element, spec. of the device, and the like.

The subpixels SP of the light emitting display device according to the aspect of the present disclosure may be formed by sequentially depositing a first electrode layer (e.g., pixel electrode or anode electrode), a light emitting layer (e.g., organic material layer), and a second electrode layer (e.g., common electrode or cathode electrode) on a substrate. In this way, in the process of depositing an organic material layer, a short may occur due to particles generated between the first electrode layer and the second electrode layer. For this reason, since a dark spot defect or bright spot defect may occur in the subpixel, an aging process for normalizing the dark spot by removing the short caused by particles may be performed for the light emitting display device, which is completely produced, before modularizing the same.

The image processor 120 may output a data enable signal DE together with the data signal DATA supplied from the outside. The image processor 120 may output one or more of a vertical synchronization signal, a horizontal synchronization signal and a clock signal in addition to the data enable signal DE, but these signals are not shown for convenience of description.

The timing controller 130 may be supplied with the data signal DATA together with a driving signal, which includes the data enable signal DE or the vertical synchronization signal, the horizontal synchronization signal and the clock signal, from the image processor 120. The timing controller 130 may output a data timing control signal DDC for controlling an operation timing of the data driver 140 and a gate timing control signal GDC for controlling an operation timing of the scan driver 150, based on the driving signal.

The data driver 140 may sample and latch the data signal DATA supplied from the timing controller 130 in response to the data timing control signal DDC supplied from the timing controller 130, and may convert the latched data signal into a gamma reference voltage and output the gamma reference voltage. The data driver 140 may output the data signal DATA through data lines DL1 to DLn. The data driver 140 may be embodied in the form of an integrated circuit (IC).

The scan driver 150 may output the scan signal in response to the gate timing control signal GDC supplied from the timing controller 130. The scan driver 150 may output the scan signal through gate lines GL1 to GLm. The scan driver 150 may be embodied in the form of an integrated circuit (IC) or may be embodied in the display panel 110 in a gate-in-panel (GIP) type.

The power supply 160 may output a high potential voltage and a low potential voltage for driving the display panel 110. The power supply 160 may supply the high potential voltage to the display panel 110 through a first power line EVDD and supply the low potential voltage to the display panel 110 through a second power line EVSS.

In the light emitting display device according to one aspect of the present disclosure, an aging signal for an aging process may be applied to the display panel 110. The aging signal may be supplied to a common electrode (e.g., cathode electrode or second electrode) of the light emitting element through the second power line EVSS during aging of the display panel 110. The aging signal is an inverse current signal input between the pixel electrode (e.g., anode electrode or first electrode) and the common electrode of the light emitting element. Particles, that is, shorted portions between the pixel electrode and the common electrode may be spaced apart from each other by an exothermic reaction of heat generated when an inverse current is applied, whereby the short state may be removed. As a result, the dark spot caused by the short may be normalized. For example, during normal driving of the light emitting display device, the power supply 160 may output a high potential voltage and input the high potential voltage to the pixel electrode (e.g., anode electrode or first electrode) of the light emitting element through the first power line EVDD, and may output a low potential voltage and input the low potential voltage to the common electrode (e.g., cathode electrode or second electrode) through the second power line EVSS. On the other hand, during aging of the light emitting display device, the power supply 160 may output an aging signal, may input the aging signal to the common electrode (e.g., cathode electrode or second electrode) of the light emitting element through the second power line EVSS, and may input a no signal or a ground voltage GND to the first power line EVDD without outputting the high potential voltage. Alternatively, the aging signal may be an external signal input regardless of the power supply 160, and an aging signal input from the outside may be input to the common electrode (e.g., cathode electrode or second electrode) of the light emitting element through the second power line EVSS.

Figure 2:
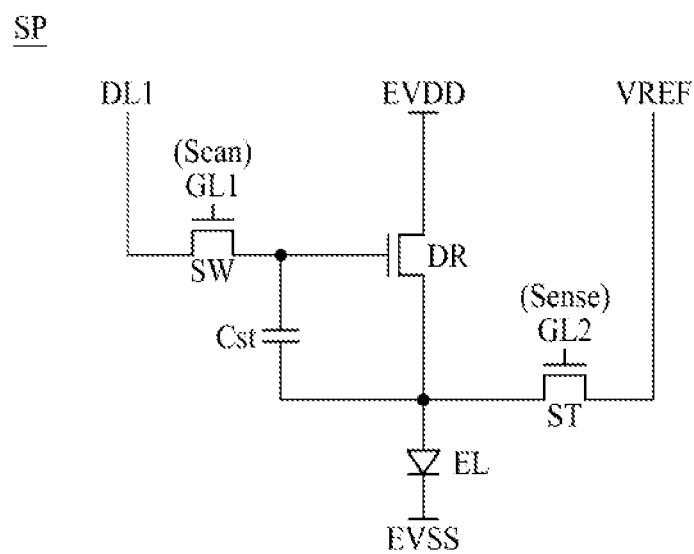
FIG. 2 is a circuit view illustrating a subpixel structure of a light emitting display device shown in FIG. 1.

FIG. 2 is a circuit view illustrating a subpixel structure of a light emitting display device shown in FIG. 1.

Referring to FIG. 2, one subpixel SP constituting a unit pixel in a light emitting display device according to one aspect of the present disclosure may include a switching thin film transistor SW, a driving thin film transistor DR, a sensing thin film transistor ST, a capacitor Cst, and a light emitting element EL.

The switching thin film transistor SW may perform a switching operation such that a data signal supplied through a first data line DL1 in response to a scan signal supplied through a first gate line GL1 is stored in the capacitor Cst as a data voltage. For example, a first electrode of the switching thin film transistor SW may be connected to the first data line DL1, and a second electrode thereof may be connected to a gate electrode of the driving thin film transistor DR.

The driving thin film transistor DR may operate to allow a driving current to flow between the first power line EVDD (e.g., high potential voltage) and the second power line EVSS (e.g., low potential voltage) in accordance with the data voltage stored in the capacitor Cst. For example, a first electrode of the driving thin film transistor DR may be connected to the first power line EVDD, and a second electrode thereof may be connected to a pixel electrode (or anode electrode or first electrode) of the light emitting element EL.

The capacitor Cst is formed between a gate and a source of the driving thin film transistor DR to charge the data voltage transmitted through the switching thin film transistor SW, and the driving thin film transistor DR may be driven in accordance with the voltage charged in the capacitor Cst.

The light emitting element EL may operate to emit light in accordance with the driving current formed by the driving thin film transistor DR. For example, the pixel electrode (or anode electrode) of the light emitting element EL may be connected to the second electrode of the driving thin film transistor DR, and the common electrode (or cathode electrode) thereof may be connected to the second power line EVSS. For example, the light emitting element EL may be an organic light emitting diode (OLED).

The sensing thin film transistor ST may be connected with a portion (hereinafter, referred to as sensing node) between the second electrode of the driving thin film transistor DR and the pixel electrode of the light emitting element EL. The sensing thin film transistor ST may operate to supply an initialization voltage (or sensing voltage) transferred through a reference line VREF to the sensing node of the driving thin film transistor DR, or to sense the sensing node of the driving thin film transistor DR or a voltage or current of the reference line VREF.

The operation time of the sensing thin film transistor ST may be similar to, identical to, or different from the switching thin film transistor SW depending on a compensation algorithm (or configuration of a compensation circuit). For example, a gate electrode of the switching thin film transistor SW may be connected to the first gate line GL1, and a gate electrode of the sensing thin film transistor ST may be connected to the second gate line GL2. In this case, a scan signal Scan may be transferred to the first gate line GL1, and a sensing signal Sense may be transferred to the second gate line GL2. For another example, the first gate line GL1 connected to the gate electrode of the switching thin film transistor SW and the second gate line GL2 connected to the gate electrode of the sensing thin film transistor ST may be connected to each other to be commonly shared.

In the example of FIG. 2, a subpixel of 3T1C structure (three transistors and one capacitor) that includes a switching thin film transistor SW, a driving thin film transistor DR, a capacitor Cst, a light emitting element EL, and a sensing thin film transistor ST has been described as an example, but each subpixel may be configured in various structures such as 2T1C, 3T2C, 4T2C, 5T1C, 6T2C, 7T1C and 7T2C depending on the configuration of the compensation circuit.

Meanwhile, the power supply 160 may generate and supply a high potential voltage and a low potential voltage, which are required for driving each of the subpixels SP. The high potential voltage generated by the power supply 160 may be input to the pixel electrode (or anode electrode) of the light emitting element EL through the first power line EVDD, and the low potential voltage generated by the power supply 160 may be input to the common electrode (or cathode electrode) of the light emitting element EL through the second power line EVSS.

In the subpixel SP of the light emitting display device according to the aspect of the present disclosure, the light emitting element EL may be formed by sequentially depositing a first electrode layer (e.g., pixel electrode or anode electrode), a light emitting layer (or organic material layer), and a second electrode layer (e.g., common electrode or cathode electrode) on a substrate. In this case, a short may occur due to particles generated between the first electrode layer and the second electrode layer in the process of depositing an organic material, whereby a dark spot defect or a bright spot defect may occur in the subpixel. Therefore, an aging process for normalizing the dark spot by removing the short caused by the particles may be performed for the light emitting display device, which is completely produced, before modularizing the light emitting display device.

Figure 3:
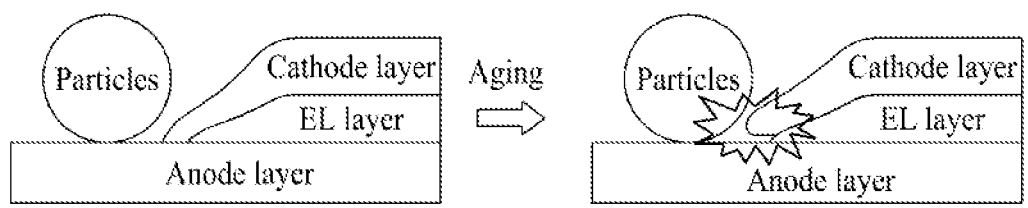
FIG. 3 is a view illustrating the principle of a light emitting display device according to the aspect of the present disclosure.

FIG. 3 is a view illustrating the principle of an aging process of a light emitting display device according to the aspect of the present disclosure.

Referring to FIG. 3, in the light emitting display device according to the aspect of the present disclosure, a first electrode layer (e.g., pixel electrode or anode electrode), a light emitting layer (or organic material layer), and a second electrode layer (e.g., common electrode or cathode electrode) may sequentially be deposited on a substrate to form a pixel (or light emitting element). However, a short may occur between the anode electrode and the cathode electrode due to particles. When the anode electrode and the cathode electrode are shorted, a dark spot may occur in the corresponding pixel.

To avoid occurrence of the dark spot, an aging process for applying an aging signal between the anode electrode and the cathode electrode may be performed after elements of the display panel are formed on the substrate. The aging signal is an inverse current signal input between the anode electrode and the cathode electrode, and when an inverse current is applied, particles, that is, shorted portions between the anode electrode and the cathode electrode are spaced apart from each other by heat of an exothermic reaction to remove the short state, whereby the dark spot caused by the short may be normalized. For example, when the light emitting display device is normally driven, the power supply 160 may output a high potential voltage and input the high potential voltage to the pixel electrode (e.g., anode electrode or first electrode) of the light emitting element through the first power line EVDD, and may output a low potential voltage and input the low potential voltage to the common electrode (e.g., cathode electrode or second electrode) of the light emitting element through the second power line EVSS. On the other hand, during aging of the light emitting display device, the power supply 160 may generate and output an aging signal which is a high potential voltage driven by a pulse, may input the aging signal to the common electrode (e.g., cathode electrode or second electrode) of the light emitting element through the second power line EVSS, and may input a no signal or a ground voltage GND to the first power line EVDD without outputting the high potential voltage. Alternatively, the aging signal may be an external signal input regardless of the power supply 160, and an aging signal input from the outside may be input to the common electrode (e.g., cathode electrode or second electrode) of the light emitting element through the second power line EVSS.

As described above, the short state between the anode electrode and the cathode electrode may be removed by the aging process to normalize the dark spot. However, the short caused by particles between the anode electrode and the cathode electrode may not be removed by the aging process depending on the state of the particles placed between the anode electrode and the cathode electrode, or a progressive dark spot defect re-shorted after the short caused by particles is removed may occur.

The inventors of the present disclosure propose a light emitting display device of a new structure in which a repair structure may be embodied to prevent all of subpixels from becoming dark spots by providing a divided structure inside a subpixel and allowing only a defective area of a subpixel from being electrically disconnected using an aging process.

Figure 4:
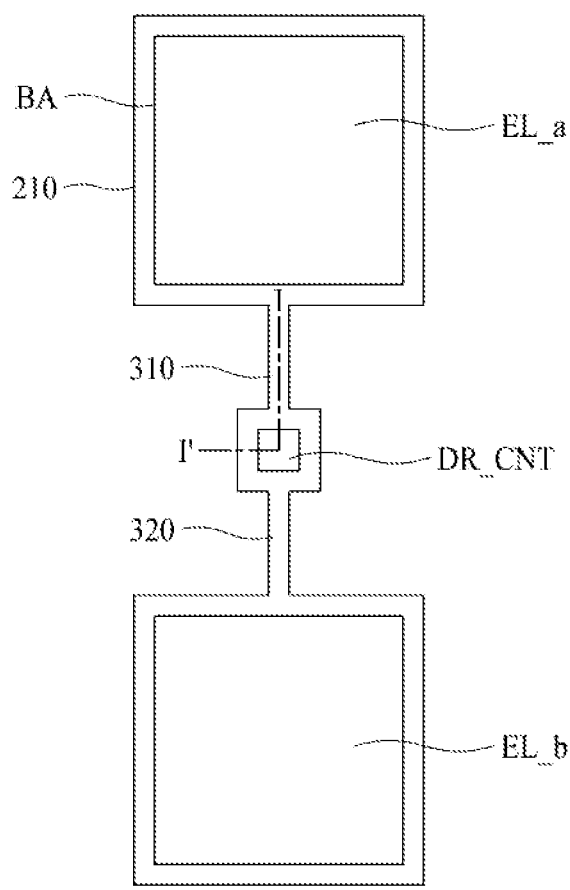
FIG. 4 is a schematic view illustrating a structure of a pixel electrode in a subpixel of a light emitting display device according to the aspect of the present disclosure.

FIG. 4 is a schematic view illustrating a structure of a pixel electrode in a subpixel of a light emitting display device according to the aspect of the present disclosure.

Referring to FIG. 4, the light emitting display device according to one aspect of the present disclosure may be provided such that the light emitting element EL of FIG. 2 is divided into a first light emitting element EL_a and a second light emitting element EL_b. The first light emitting element EL_a and the second light emitting element EL_b may electrically be connected with a pixel circuit comprised of the switching thin film transistor SW, the sensing thin film transistor ST, the capacitor Cst and the driving thin film transistor DR of FIG. 2. For example, the first light emitting element EL_a and the second light emitting element EL_b may electrically be connected to the driving thin film transistor DR included in the pixel circuit, and may be divided into both sides with a contact portion DR_CNT of the driving thin film transistor DR, which is interposed therebetween.

The first light emitting element EL_a and the second light emitting element EL_b may include a pixel electrode, a common electrode, and a light emitting layer interposed between the pixel electrode and the common electrode.

Referring to FIG. 4, the first light emitting element EL_a and the second light emitting element EL_b may include a pixel electrode 210, and a bank layer BA having an opening defining a light emission area may be disposed on the pixel electrode 210. The pixel electrode 210 may include a first pixel electrode portion positioned to correspond to the first light emitting element EL_a, a second pixel electrode portion positioned to correspond to the second light emitting element EL_b and spaced apart from the first pixel electrode portion, and a circuit contact portion connected to the driving thin film transistor DR included in the pixel circuit through a contact portion DR_CNT.

According to the aspect of the present disclosure, the pixel electrode 210 may include a first electrode connection portion 310 connected or disconnected between the first pixel electrode portion and the circuit contact portion, and a second electrode connection portion 320 connected or disconnected between the second pixel electrode portion and the circuit contact portion. For example, the first electrode connection portion 310 and the second electrode connection portion 320 may be disposed between the first pixel electrode portion and the second pixel electrode portion with the circuit contact portion interposed therebetween. In addition, a length of the first electrode connection portion 310 and the second electrode connection portion 320 may correspond to a shortest distance between the first and second pixel electrode portions and the circuit contact portion, respectively.

Figure 5:
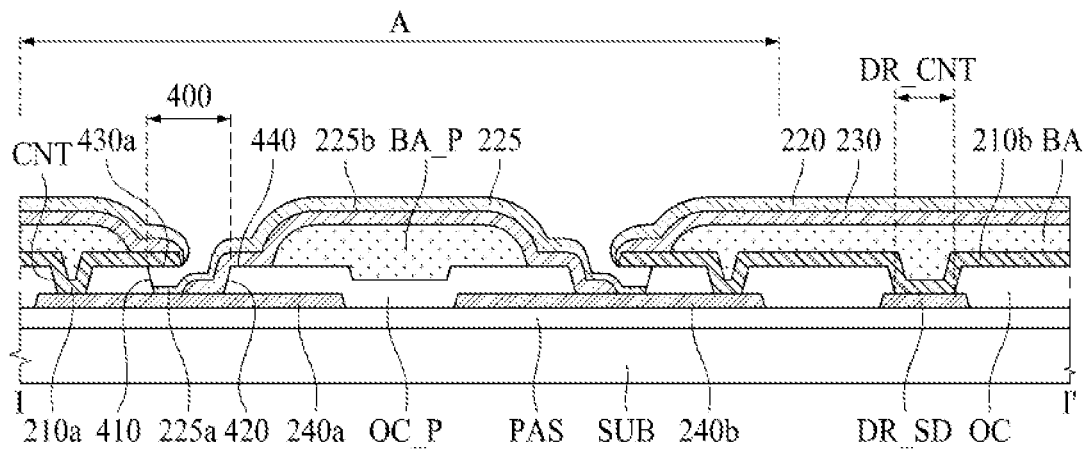
FIG. 5 is a cross-sectional view taken along line I-I' of FIG. 4.
Figure 6:
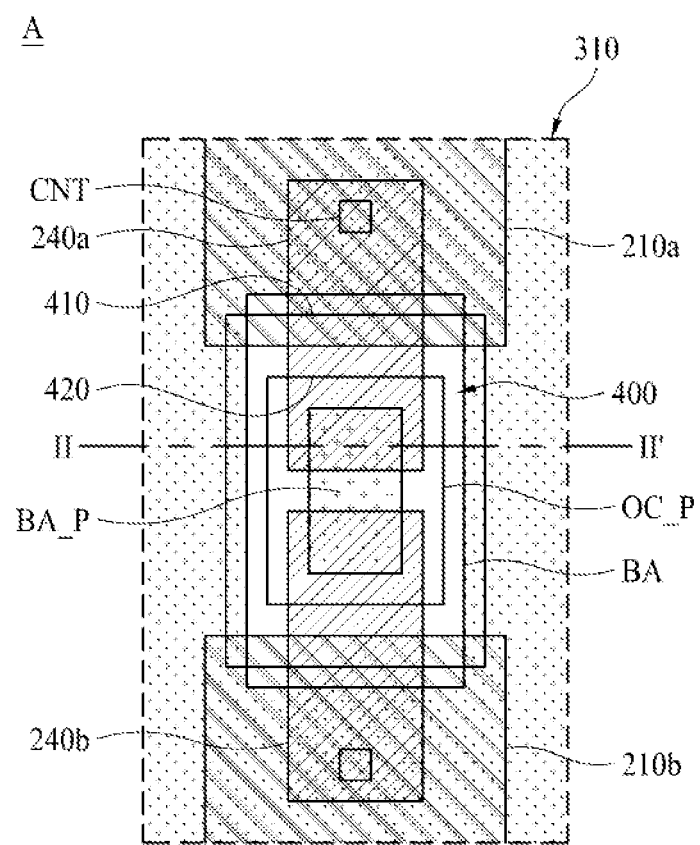
FIG. 6 is a plane view illustrating a plane structure of an area A of FIG. 5.
Figure 7:
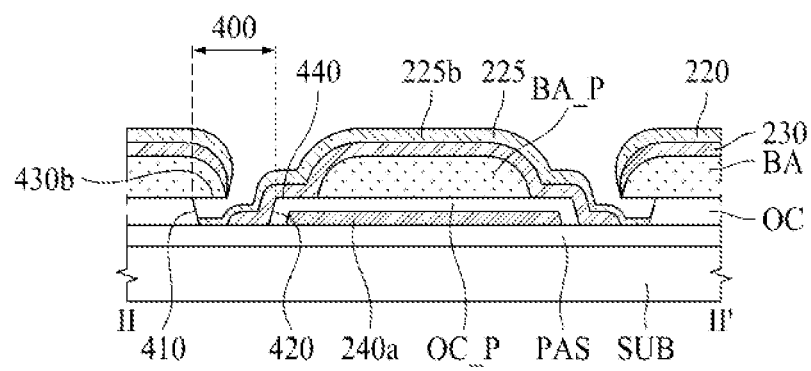
FIG. 7 is a cross-sectional view taken along line II-II' of FIG. 6.

FIG. 5 is a cross-sectional view taken along line I-I' of FIG. 4. FIG. 6 is a plane view illustrating a plane structure of an area A of FIG. 5. FIG. 7 is a cross-sectional view taken along line II-II' of FIG. 6. FIG. 5 shows a sectional structure of a first electrode connection portion 310 disposed between a first pixel electrode portion and a circuit contact portion, and FIG. 6 shows a plane structure except a light emitting layer and a common electrode in the first electrode connection portion 310, and FIG. 7 shows a sectional structure of the first electrode connection portion 310 in a direction different from FIG. 5. Also, although FIGS. 5 to 7 show only the first electrode connection portion 310, the second electrode connection portion 320 may have a shape substantially the same as that of the first electrode connection portion 310.

The first electrode connection portion 310 of the light emitting display device according to one aspect of the present disclosure will be described in detail with reference to FIGS. 5 to 7.

As shown in FIG. 5, a pixel circuit comprised of a plurality of thin film transistors may be formed on a substrate SUB, and a planarization layer PAS may be formed on the pixel circuit. A source/drain electrode DR_SD of the driving thin film transistor DR included in the pixel circuit may be disposed on the planarization layer PAS. The source/drain electrode DR_SD of the driving thin film transistor DR may be positioned in a circuit contact portion between the first pixel electrode portion and the second pixel electrode portion.

In FIG. 5, the first electrode connection portion 310 may be disposed in an area A. Also, although not shown in FIG. 5, the second electrode connection portion 320 may have a shape substantially the same as that of the first electrode connection portion 310. The first electrode connection portion 310 may include a first electrode pattern 210a extended from the first pixel electrode portion, a second electrode pattern 210b extended from the circuit contact portion, a common electrode connection pattern 225 disposed to be spaced from and between the first electrode pattern 210a and the second electrode pattern 210b, a first electrode connection pattern 240a electrically connecting the first electrode pattern 210a with the common electrode connection pattern 225, and a second electrode connection pattern 240b spaced apart from the first electrode connection pattern 240a, electrically connecting the second electrode pattern 210b with the common electrode connection pattern 225.

The first and second electrode connection patterns 240a and 240b may be disposed to be spaced apart from each other on the planarization layer PAS and to be coplanar with the source/drain electrode DR_SD of the driving thin film transistor DR. An overcoat layer OC may be formed on the first and second electrode connection patterns 240a and 240b and the source/drain electrode DR_SD.

The first and second electrode patterns 210a and 210b may be disposed to at least partially overlap the first and second electrode connection patterns 240a and 240b on the overcoat layer OC and spaced apart from each other. the first and second electrode patterns 210a and 210b may electrically be connected with the first and second electrode connection patterns 240a and 240b through a contact hole CNT formed in the overcoat layer OC, respectively. The first and second electrode patterns 210a and 210b may be made of the same material as that of the pixel electrode 210 including the first and second pixel electrode portions and the circuit contact portion.

The overcoat layer OC positioned between the first and second electrode patterns 210a and 210b, as shown in FIGS. 5 and 6, may include an overcoat pattern OC_P formed to cover an end of each of the first and second electrode connection patterns 240a and 240b, and a through hole 400 formed to surround the overcoat pattern OC_P and expose a lower portion of an end of each of the first and second electrode patterns 210a and 210b and a portion of an upper surface of the first and second electrode connection patterns 240a and 240b. An outer side 410 of the through hole 400 may be positioned more inwardly than the end of each of the first and second electrode patterns 210a and 210b to expose the lower portion of an end of each of the first and second electrode patterns 210a and 210b, whereby an undercut structure 430a may be formed.

As shown in FIGS. 5 and 6, a bank layer BA may include a bank pattern BA_P formed to have a step difference structure 440 on the overcoat pattern OC_P, and a bank hole formed to surround the bank pattern BA_P and at least partially overlap the through hole 400 of the overcoat layer OC.

A light emitting layer 230 and a common electrode connection pattern 225 may be formed on the overcoat pattern OC_P and the bank pattern BA_P. The common electrode connection pattern 225 may be formed to extend from the bank pattern BA_P through the step difference structure 440 on the overcoat pattern OC_P and an inner surface 420 of the through hole 400 to the upper surface of the first and second electrode connection patterns 240a and 240b exposed through the through hole 400. The first and second electrode connection patterns 240a and 240b may be electrically connected to each other through the common electrode connection pattern 225. The common electrode connection pattern 225 may be made of the same material as that of the common electrode 220.

As shown in FIGS. 6 and 7, the common electrode 220 may be formed to be spaced apart from the common electrode connection pattern 225 through an undercut structure 430b formed as the outer side 410 of the through hole 400 of the overcoat layer OC that is positioned more inwardly than the end of the bank layer BA. The common electrode connection pattern 225 and the common electrode 220 may electrically be disconnected from each other.

Figure 8A:
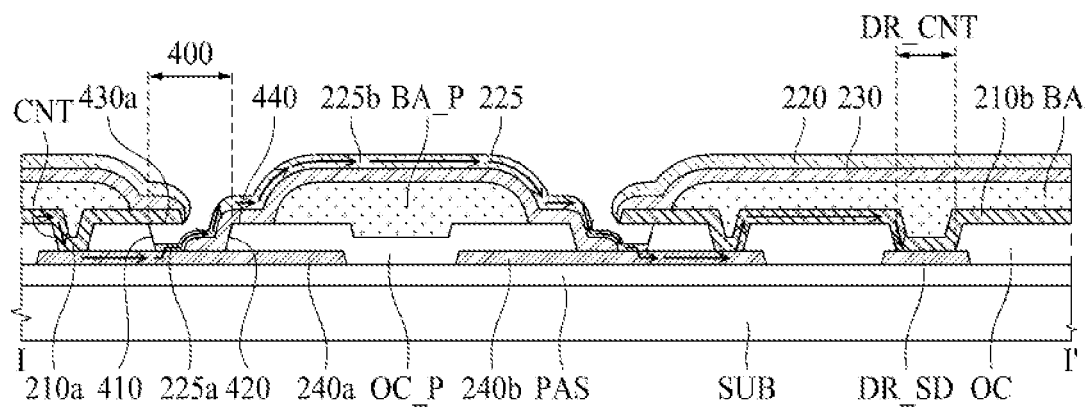
FIGS. 8A to 8C are views illustrating a current flow and a repair state during aging in an electrode connection portion of a light emitting display device according to the aspect of the present disclosure.
Figure 8B:
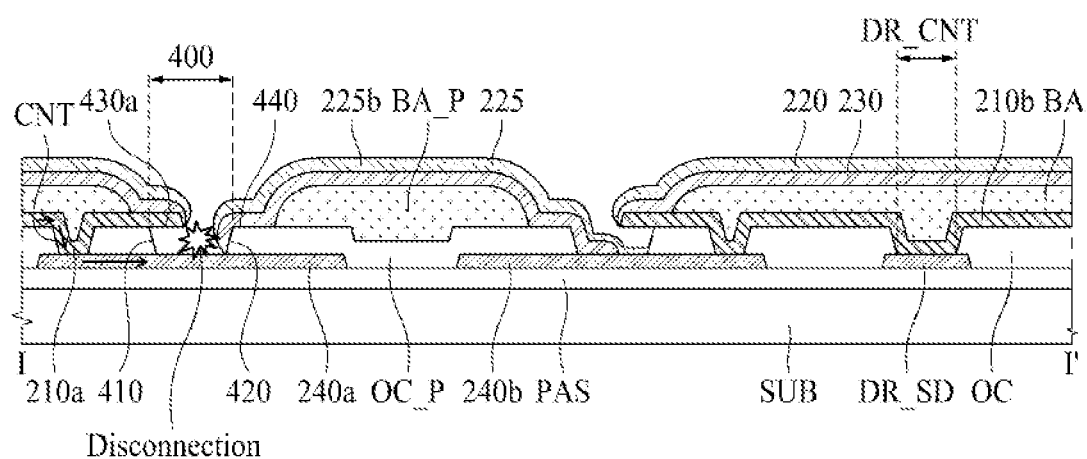
Figure 8C:
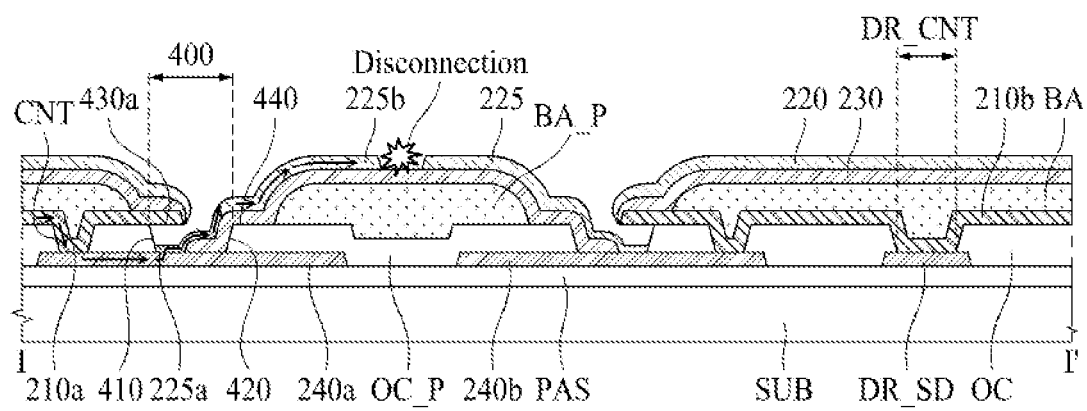

FIGS. 8A to 8C are views illustrating a current flow and a repair state during aging in an electrode connection portion of a light emitting display device according to the aspect of the present disclosure.

As shown in FIG. 8A, the first electrode connection portion 310 according to one aspect of the present disclosure may comprise the first electrode pattern 210a extended from the first pixel electrode portion, the second electrode pattern 210b extended from the circuit contact portion, and the common electrode connection pattern 225 between the first electrode pattern 210a and the second electrode pattern 210b, wherein the first and second electrode connection patterns 240a and 240b electrically connects the first electrode pattern 210a and the second electrode pattern 210b with the common electrode connection pattern 225, respectively, and, wherein the first electrode pattern 210a and the second electrode pattern 210b are spaced apart from each other. During the aging process, as indicated by arrows in FIG. 8A, an inverse current signal directed from the first and second pixel electrode portions to the circuit contact portion may flow through the first and second electrode connection portions 310 and 320. For example, when a short based on particles occurs between a pixel electrode (or anode electrode) corresponding to the first pixel electrode portion and a common electrode (or cathode electrode), an inverse current signal may flow only through the first electrode connection portion 310, and the inverse current signal may not flow to the second electrode connection portion 320 connected to the second pixel electrode portion in which a short based on particles does not occur.

When a strong short based on particles occurs between the pixel electrode (or anode electrode) and the common electrode (or cathode electrode) positioned on either the first pixel electrode portion or the second pixel electrode portion during the aging process, an inverse current value from the pixel electrode portion in which a strong short based on particles occurs may be increased remarkably, whereby higher heat may be applied to the common electrode connection pattern 225 of which electrode connection portion connected with the corresponding pixel electrode portion has high resistance. Then, as shown in FIG. 8B, a portion (shown as 225a in FIG. 8A) of the common electrode connection pattern 225, which is in contact with the first electrode connection pattern 240a, may be disconnected or removed. Alternatively, as shown in FIG. 8C, a central portion 225b of the common electrode connection pattern 225 may be disconnected or removed. Therefore, the pixel electrode portion in which a strong short based on particles occurs and the pixel circuit are electrically disconnected from each other, whereby the light emitting display device may be repaired such that the corresponding pixel area becomes a dark spot and the other pixel area is activated.

Figure 9:
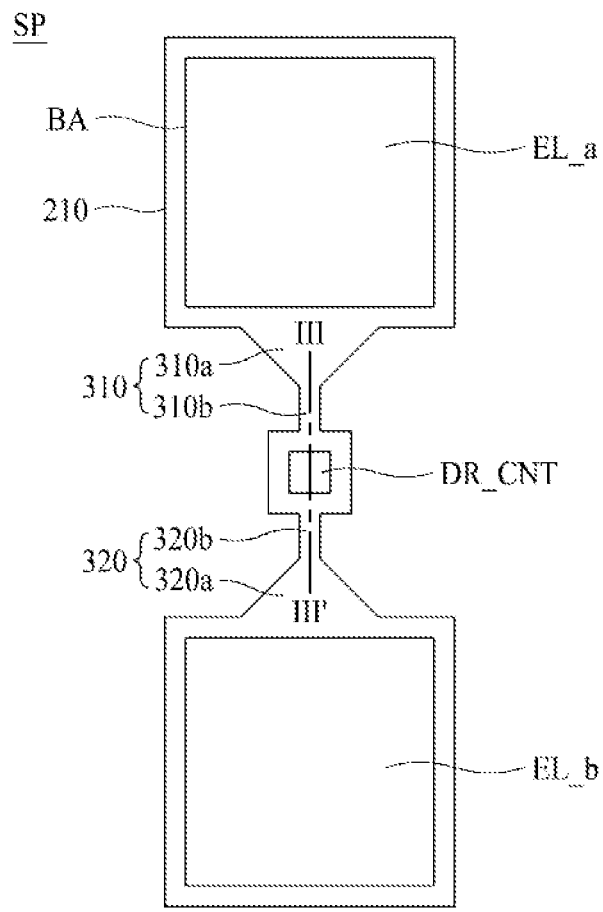
FIG. 9 is a schematic view illustrating a structure of a pixel electrode in a subpixel of a light emitting display device according to another aspect of the present disclosure.
Figure 10:
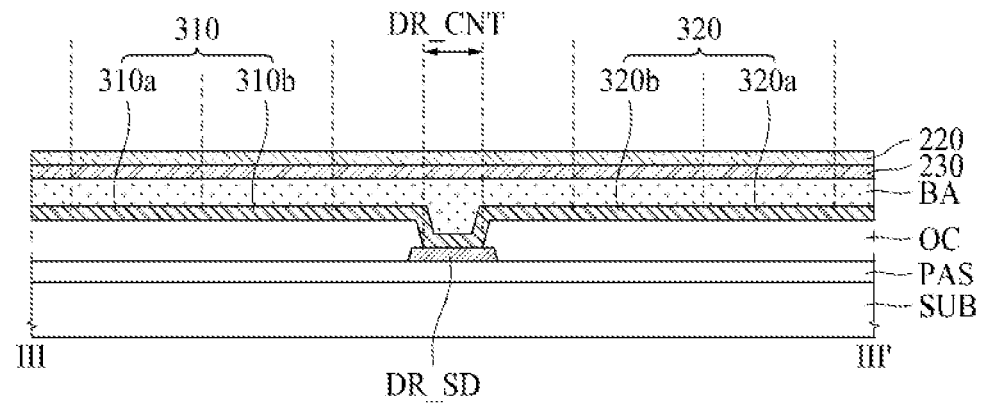
FIG. 10 is a cross-sectional view taken along line III-III' of FIG. 9.

FIG. 9 is a schematic view illustrating a structure of a pixel electrode in a subpixel of a light emitting display device according to another aspect of the present disclosure. FIG. 10 is a cross-sectional view taken along line III-III' of FIG. 9. In FIGS. 9 and 10, a structure of an electrode connection portion is modified from the structure of the pixel electrode shown in FIG. 4. Therefore, only the elements modified from the structure of the pixel electrode of FIG. 4 will be described, and the description duplicated with the other same elements will be omitted.

Referring to FIGS. 9 and 10, the pixel electrode 210 of the light emitting display device according to another aspect of the present disclosure may include a first electrode connection portion 310 connected or disconnected between a first pixel electrode portion and a circuit contact portion, and a second electrode connection portion 320 connected or disconnected between a second pixel electrode portion and the circuit contact portion. For example, the first electrode connection portion 310 and the second electrode connection portion 320 may be disposed between the first pixel electrode portion and the second pixel electrode portion with the circuit contact portion interposed therebetween. In addition, a size of each of the first electrode connection portion 310 and the second electrode connection portion 320 may be reduced toward the circuit contact portion. Also, a length of the first electrode connection portion 310 and the second electrode connection portion 320 may correspond to a shortest distance between the first and second pixel electrode portions and the circuit contact portion, respectively.

The first electrode connection portion 310 may include a first electrode portion 310a extended from the first pixel electrode portion and a second electrode portion 310b extended from the circuit contact portion connected to the driving thin film transistor DR included in the pixel circuit through a contact portion DR_CNT. The second electrode connection portion 320 may include a first electrode portion 320a extended from the second pixel electrode portion and a second electrode portion 320b extended from the circuit contact portion. The first and second electrode connection portions 310 and 320 may have substantially the same shape as each other except for their respective connection directions different from each other.

As shown in FIG. 9, the first electrode portion 310a and the second electrode portion 310b may integrally formed to reach the circuit contact portion. In addition, the first electrode portion 310a and the second electrode portion 310b may be made of the same material as that of the pixel electrode 210 that includes the first and second pixel electrode portions and the circuit contact portion.

For example, the first electrode portion 310a and the second electrode portion 310b of the first electrode connection portion 310 may have their respective areas different from each other, and the area of the first electrode portion 310a may be larger than that of the second electrode portion 310b. The first electrode portion 310a may have a first width in a portion that is in contact with the first pixel electrode portion, and may have a second width narrower than the first width in a portion that is in contact with the second electrode portion 310b. The second electrode portion 310b may have a third width that is equal to or narrower than the second width of the first electrode portion 310a. For example, the first electrode connection portion 310 may form a short neck structure in which a width is gradually reduced from the first electrode portion 310a to the circuit contact portion and a narrow width is formed from the second electrode portion 310b to the circuit contact portion.

As shown in FIG. 10, a pixel circuit comprised of a plurality of thin film transistors may be formed on a substrate, a planarization layer PAS may be formed on the pixel circuit, and a source/drain electrode DR_SD of the driving thin film transistor DR included in the pixel circuit may be disposed on the planarization layer PAS. For example, the source/drain electrode DR_SD of the driving thin film transistor DR may be positioned in the circuit contact portion between the first pixel electrode portion and the second pixel electrode portion.

The first and second electrode connection portions 310 and 320 may include first electrode portions 310a and 320a and second electrode portions 310b and 320b, respectively.

An overcoat layer OC may be formed on the source/drain electrode DR_SD of the driving thin film transistor DR, and the first electrode portions 310a and 320a and the second electrode portions 310b and 320b may be disposed to be integrally connected to each other on the overcoat layer OC.

A bank layer BA may be formed on the first electrode portions 310a and 320a and the second electrode portions 310b and 320b, a light emitting layer 230 may be formed on the bank layer BA, and a common electrode 220 may be formed on the light emitting layer 230.

Figure 11A:
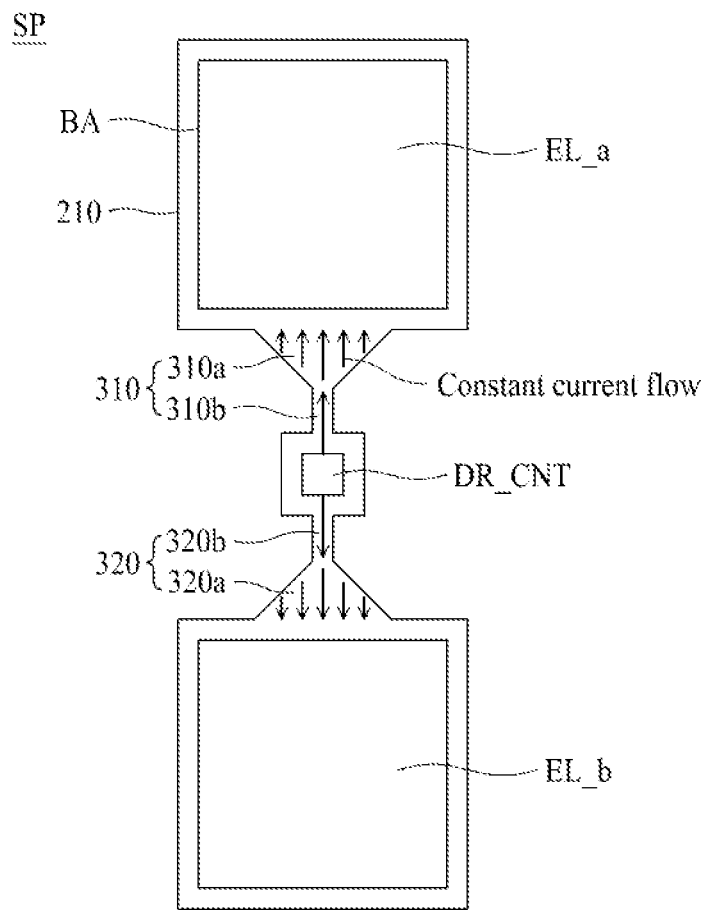
FIGS. 11A and 11B are views illustrating a current flow during normal driving in an electrode connection portion of a light emitting display device according to another aspect of the present disclosure.
Figure 11B:
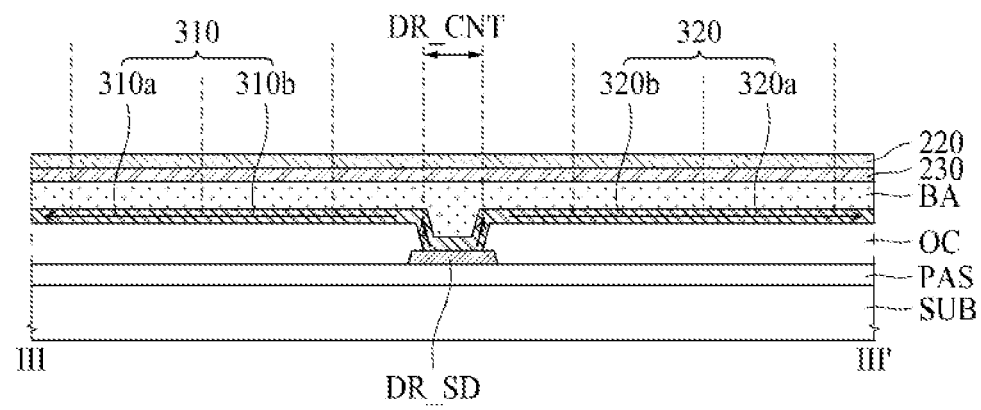

FIGS. 11A and 11B are views illustrating a current flow during normal driving in an electrode connection portion of a light emitting display device according to another aspect of the present disclosure.

As shown in FIGS. 11A and 11B, in the first and second electrode connection portions 310 and 320 according to one aspect of the present disclosure, a constant current signal directed from the circuit contact portion connected to the driving thin film transistor DR through the contact portion DR_CNT to the first and second electrode portions may flow through the first and second electrode connection portions 310 and 320 when the light emitting display device is normally driven. At this time, since the constant current signal passes through the first electrode portions 310*a* and 320*a* that are wider from the second electrode portions 310*b* and 320*b* of the first and second electrode connection portions 310 and 320, the constant current signal may actively flow without increase of resistance.

Figure 12A:
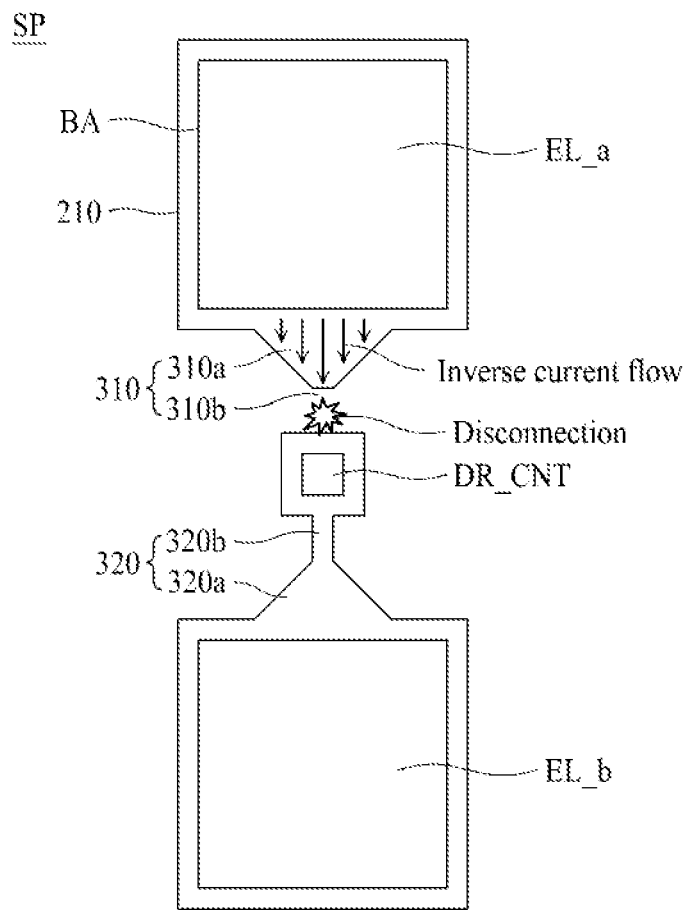
FIGS. 12A and 12B are views illustrating a current flow and a repair state during aging in an electrode connection portion of a light emitting display device according to another aspect of the present disclosure.
Figure 12B:
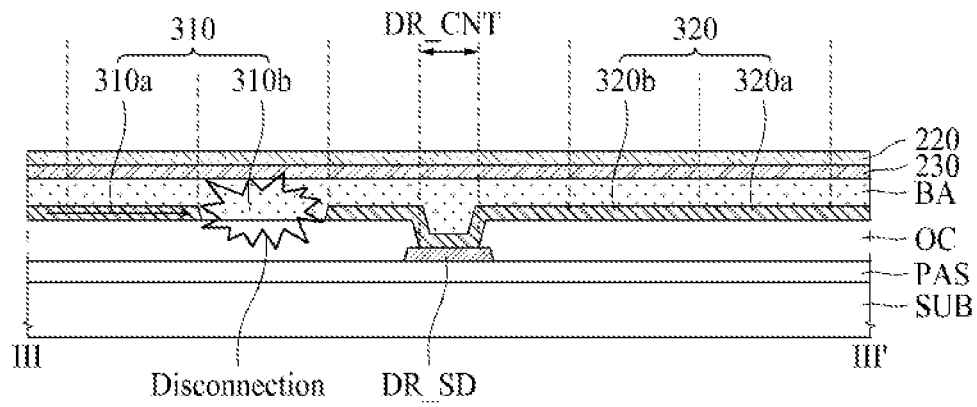

FIGS. 12A and 12B are views illustrating a current flow and a repair state during aging in an electrode connection portion of a light emitting display device according to another aspect of the present disclosure.

As shown in FIGS. 12A and 12B, an inverse current signal directed from the first and second pixel electrode portions to the circuit contact portion may flow to the first and second electrode connection portions 310 and 320 during aging of the light emitting display device. For example, as shown in FIG. 12A, when a short based on particles occurs between a pixel electrode (or anode electrode) corresponding to the first pixel electrode portion and a common electrode (or cathode electrode), the inverse current signal may flow only through the first electrode connection portion 310. In addition, the inverse current signal may not flow to the second electrode connection portion 320 connected to the second pixel electrode portion in which the short based on particles does not occur.

When a strong short based on particles occurs between the pixel electrode (or anode electrode) and the common electrode (or cathode electrode), which correspond to the first pixel electrode portion of the first pixel electrode portion and the second pixel electrode portion, during the aging process, an inverse current value from the first pixel electrode portion in which a strong short based on particles occurs may be increased remarkably. As a result, higher heat may be applied to the second electrode portion 310*b* having a short neck structure in which a width is reduced in the first electrode connection portion 310 connected with the first pixel electrode portion. Then, the second electrode portion 310*b* of the first electrode connection portion 310 may be disconnected or removed. Therefore, the pixel electrode portion in which a strong short based on particles occurs and the pixel circuit are electrically disconnected from each other, whereby the light emitting display device may be repaired such that the pixel area corresponding to the first pixel electrode portion becomes a dark spot and the pixel area corresponding to the second pixel electrode portion is activated.

FIGS. 13 to 16 are circuit views illustrating aging and repair processes for a light emitting display device according to the aspect of the present disclosure. FIG. 17 is a view illustrating an aging and repair state of a light emitting display device according to the aspect of the present disclosure.

An aging process and a repair process in a light emitting display device according to the aspect of the present disclosure will be described in more detail with reference to FIGS. 13 to 16.

Figure 13:
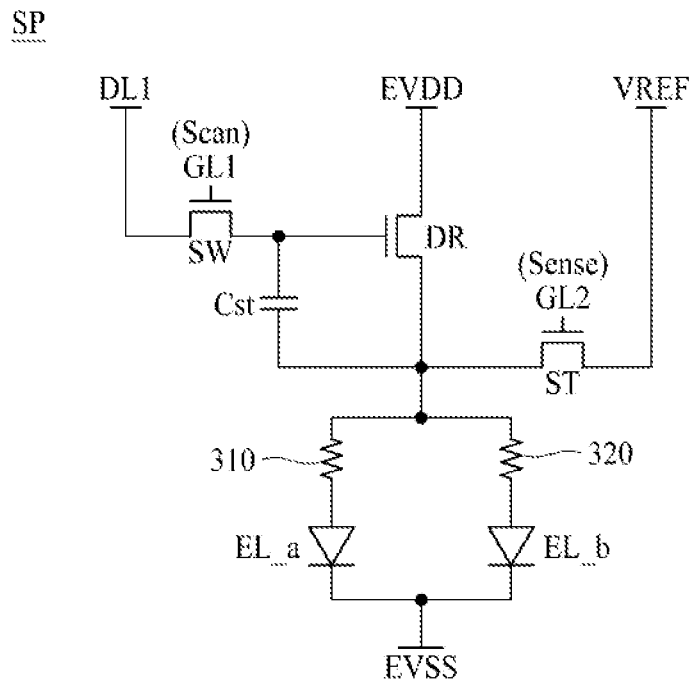
FIGS. 13 to 16 are circuit views illustrating aging and repair processes for a light emitting display device according to the aspect of the present disclosure.

As shown in FIG. 13, the light emitting element EL may be divided into a first light emitting element EL_a and a second light emitting element EL_b. Resistance based on the first and second electrode connection portions 310 and 320 may be disposed between the driving thin film transistor DR and each of the first light emitting element EL_a and the second light emitting element EL_b.

Figure 14:
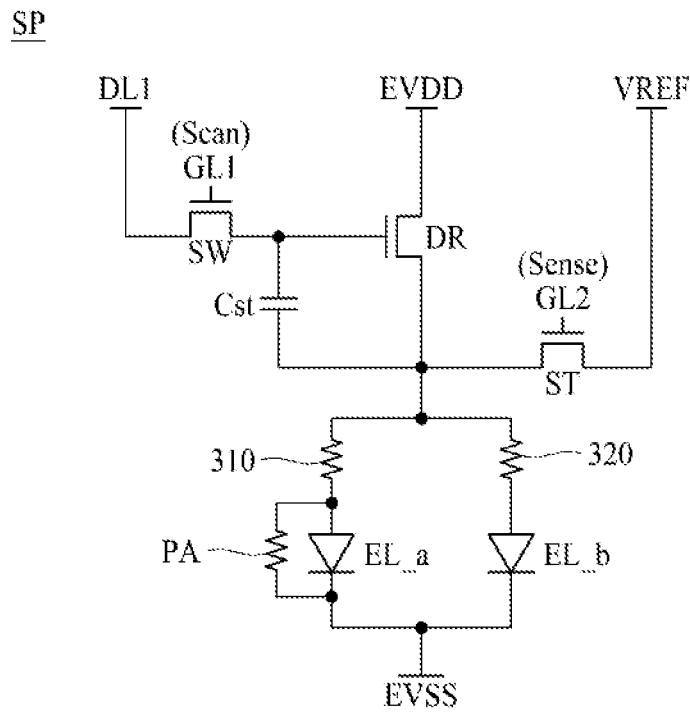

As shown in FIG. 14, when particles PA are placed between the pixel electrode (or anode electrode) and the common electrode (or cathode electrode) of the first light emitting element EL_a of the first light emitting element EL_a and the second light emitting element EL_b, a short may occur between the pixel electrode and the common electrode of the first light emitting element EL_a due to the particles PA.

Figure 15:
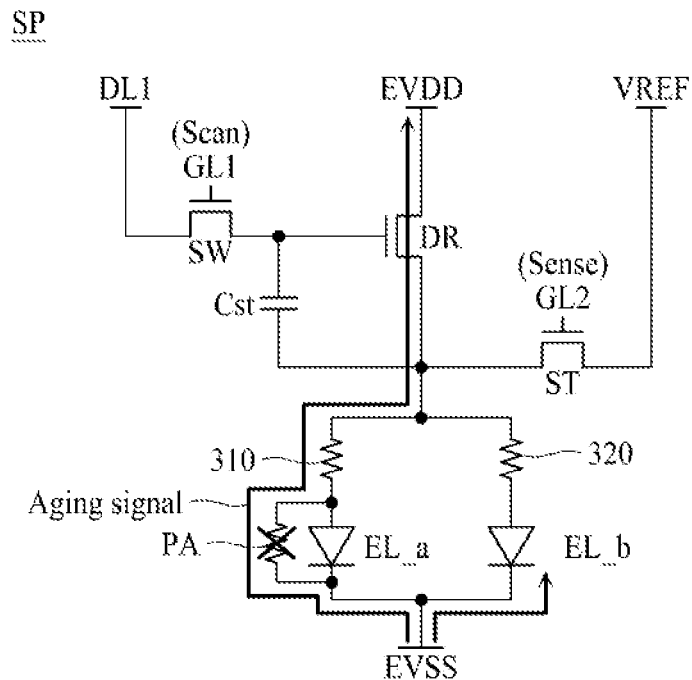

As shown in FIG. 15, in the aging process, a first aging signal that is a high potential voltage, unlike a low potential voltage during normal driving, may be applied to the common electrode of each of the first light emitting element EL_a and the second light emitting element EL_b through the second power line EVSS, and a second aging signal that is a low potential voltage having a constant potential difference from the first aging signal may be applied to the first power line EVDD, whereby the aging signal that is an inverse current signal may generate heat between the pixel electrode and the common electrode, and may be output through the first power line EVDD. At this time, since a short based on particles does not occur in the second light emitting element EL_b in which the particles PA do not remain, the inverse current based on the aging signal does not flow to the second light emitting element EL_b, whereby the exothermic phenomenon may not affect the pixel electrode, the light emitting layer and the common electrode of the second light emitting element EL_b. In addition, the inverse current value may be increased in the first light emitting element EL_a in which the particles PA remain, due to an electrical short phenomenon due to the particles PA between the pixel electrode (or anode electrode) and the common electrode (or cathode electrode), whereby the short caused by the particles PA may be removed by heat generated between the pixel electrode and the common electrode. As a result, the first light emitting element EL_a may be normalized. In FIG. 17, during an aging process performed for a pixel that becomes a dark spot due to A-C short (anode electrode-common electrode short), when weak A-C short occurs, the dark spot is normalized.

Figure 16:
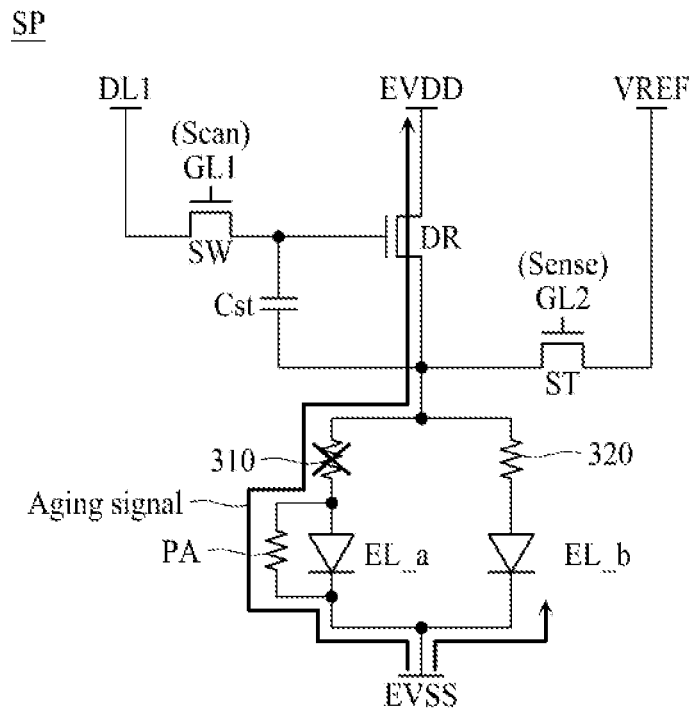
Figure 17:
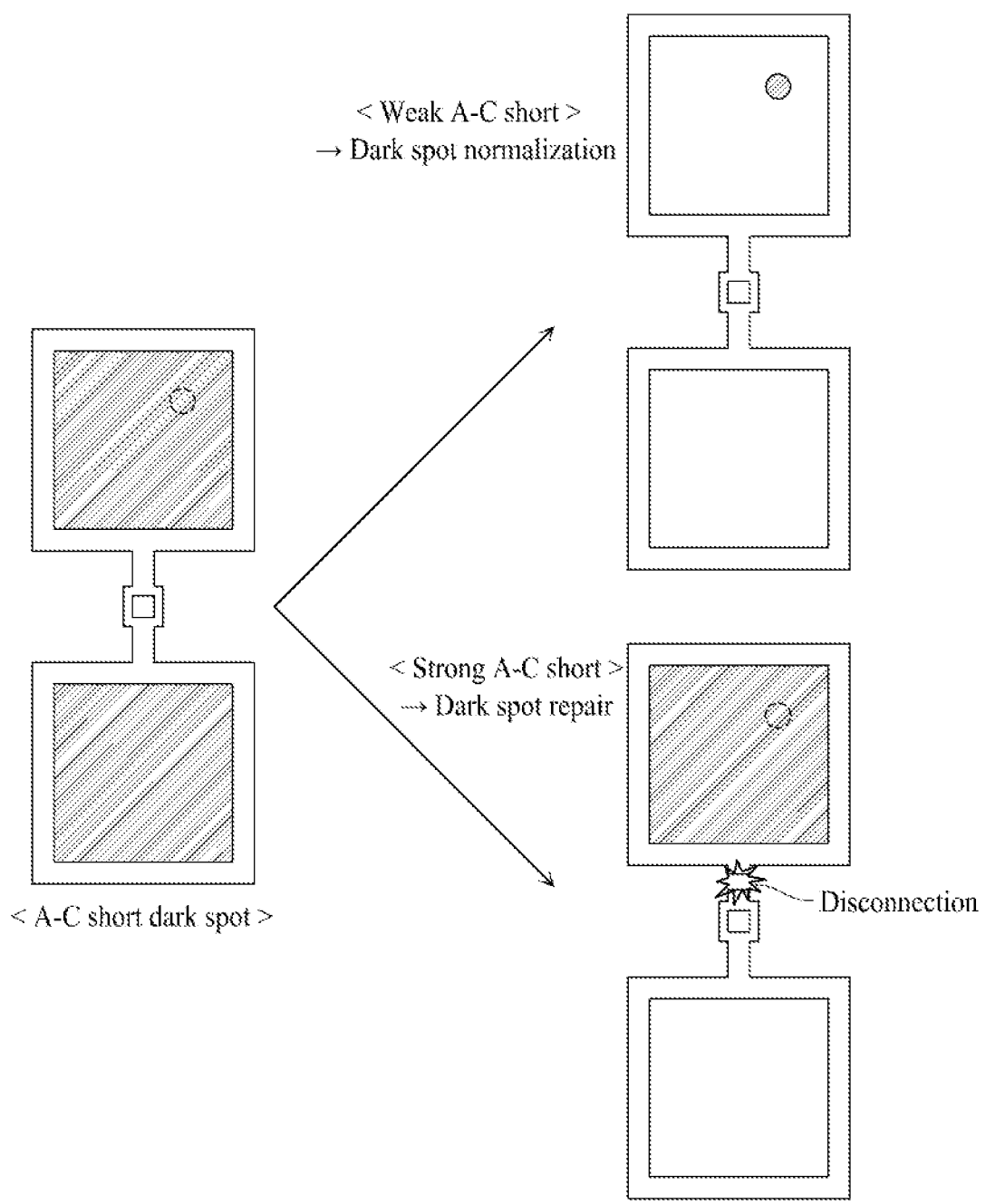
FIG. 17 is a view illustrating an aging and repair state of a light emitting display device according to the aspect of the present disclosure.

As shown in FIG. 16, when a strong short based on particles occur between the pixel electrode (or anode electrode) and the common electrode (or cathode electrode) of the first light emitting element EL_a, an inverse current value from the first light emitting element EL_a may be increased remarkably due to occurrence of the strong short based on particles, whereby a higher heat may be applied to the first electrode connection portion 310 connected with the first light emitting element EL_a. Then, at least a portion of the first electrode connection portion 310 may be disconnected or removed. Therefore, the first light emitting element EL_a in which a strong short based on particles occur and the pixel circuit may electrically be disconnected from each other, whereby the light emitting display device may be repaired such that the first light emitting element EL_a becomes a dark spot and the second light emitting element EL_b is activated. In FIG. 17, during an aging process performed for a pixel that becomes a dark spot due to A-C short, when strong A-C short occurs, the electrode connection portion may be disconnected to repair the corresponding pixel.

The light emitting display device according to the aspect of the present disclosure may be described as follows.

The light emitting display device according to the aspect of the present disclosure may comprise a light emitting element including a pixel electrode, a common electrode, and a light emitting layer interposed between the pixel electrode and the common electrode, and a pixel circuit electrically connected to the pixel electrode of the light emitting element, wherein the pixel electrode may include a first pixel electrode portion, a second pixel electrode portion spaced apart from the first pixel electrode portion, a circuit contact portion connected to the pixel circuit, a first electrode connection portion connected or disconnected between the first pixel electrode portion and the circuit contact portion, and a second electrode connection portion connected or disconnected between the second pixel electrode portion and the circuit contact portion.

In the light emitting display device according to the aspect of the present disclosure, the circuit contact portion and each of the first electrode connection portion and the second electrode connection portion may be disposed between the first pixel electrode portion and the second pixel electrode portion.

In the light emitting display device according to the aspect of the present disclosure, resistance of the first electrode connection portion may be higher than that of the first pixel electrode portion, and the resistance of the second electrode connection portion is higher than that of the second pixel electrode portion.

In the light emitting display device according to the aspect of the present disclosure, a size of each of the first and second electrode connection portions may gradually be reduced toward the circuit contact portion.

In the light emitting display device according to the aspect of the present disclosure, a length of the first electrode connection portion may correspond to a shortest distance between the first pixel electrode portion and the circuit contact portion, and a length of the second electrode connection portion corresponds to a shortest distance between the second pixel electrode portion and the circuit contact portion.

The light emitting display device according to the aspect of the present disclosure may further comprise a driving thin film transistor included in the pixel circuit, and at least one insulating film disposed between the driving thin film transistor and the circuit contact portion, wherein the circuit contact portion may electrically be connected with a source/drain electrode of the driving thin film transistor through a contact hole formed in the at least one insulating film.

In the light emitting display device according to the aspect of the present disclosure, the first electrode connection portion may include a first electrode pattern extended from the first pixel electrode portion, the second electrode connection portion includes a first electrode pattern extended from the second pixel electrode portion, and each of the first and second electrode connection portions includes a second electrode pattern extended from the circuit contact portion, a common electrode connection pattern disposed to be spaced from and between the first electrode pattern and the second electrode pattern, a first electrode connection pattern electrically connecting the first electrode pattern with the common electrode connection pattern, and a second electrode connection pattern spaced apart from the first electrode connection pattern, electrically connecting the second electrode pattern with the common electrode connection pattern.

In the light emitting display device according to the aspect of the present disclosure, the first and second electrode connection patterns in each of the first and second electrode connection portions may be disposed to be spaced apart from each other on the same plane as the source/drain electrode of the driving thin film transistor, an overcoat layer may be disposed on the first and second electrode connection patterns, first and second electrode patterns overlapped with the first and second electrode connection patterns may be disposed to be spaced apart from each other on the overcoat layer, a bank layer may be disposed on the first and second electrode patterns, the light emitting layer may be disposed on the bank layer, and the common electrode and the common electrode connection pattern may be disposed on the light emitting layer.

In the light emitting display device according to the aspect of the present disclosure, the first electrode pattern may electrically be connected with the first electrode connection pattern through a first contact hole formed in the overcoat layer, and the second electrode pattern may electrically be connected with the second electrode connection pattern through a second contact hole formed in the overcoat layer.

In the light emitting display device according to the aspect of the present disclosure, the overcoat layer positioned between the first and second electrode patterns may include an overcoat pattern formed to cover an end of each of the first and second electrode connection patterns, and a through hole formed to surround the overcoat pattern and expose a lower portion of an end of each of the first and second electrode patterns and a portion of an upper surface of the first and second electrode connection patterns.

In the light emitting display device according to the aspect of the present disclosure, the bank layer may include a bank pattern formed on the overcoat pattern to have a step difference, and a bank hole formed to surround the bank pattern and at least partially overlap the through hole of the overcoat layer.

In the light emitting display device according to the aspect of the present disclosure, the common electrode connection pattern may be disposed on the overcoat pattern and the bank pattern, and may be in contact with the upper surface of the first and second electrode connection patterns, which is exposed through the through hole of the overcoat layer.

In the light emitting display device according to the aspect of the present disclosure, the first electrode pattern and the second electrode pattern may be made of the same material as that of the first and second pixel electrode portions and the circuit contact portion, the common electrode connection pattern may be made of the same material as that of the common electrode, and the first electrode connection pattern and the second electrode connection pattern may be made of the same material as that of the source/drain electrode of the driving thin film transistor.

In the light emitting display device according to the aspect of the present disclosure, when a dark spot defect occurs in a light emitting element area corresponding to the first pixel electrode portion or the second pixel electrode portion, at least a portion of the common electrode connection pattern, which is connected with a pixel electrode portion corresponding to the dark spot defect, may be disconnected or removed to electrically separate the corresponding pixel electrode portion from the pixel circuit.

In the light emitting display device according to the aspect of the present disclosure, the first electrode connection portion includes a first electrode portion extended from the first pixel electrode portion, and a second electrode portion extended from the circuit contact portion, the second electrode connection portion includes a first electrode portion extended from the second pixel electrode portion and a second electrode portion extended from the circuit contact portion, for each of the first electrode connection portion and the second electrode connection portion, and an area of the first electrode portion may be larger than that of the second electrode portion.

In the light emitting display device according to the aspect of the present disclosure, for the first electrode connection portion, the first electrode portion may have a first width in a portion that is in contact with the first pixel electrode portion, and may have a second width, which is narrower than the first width, in a portion that is in contact with the circuit contact portion, and for the second electrode connection portion, the first electrode portion has a first width in a portion that is in contact with the second pixel electrode portion, and has a second width, which is narrower than the first width, in a portion that is in contact with the circuit contact portion.

In the light emitting display device according to the aspect of the present disclosure, for each of the first electrode connection portion and the second electrode connection portion, the second electrode portion may have a third width that is equal to or narrower than the second width of the first electrode portion.

In the light emitting display device according to the aspect of the present disclosure, each of the first and second electrode connection portions may include an overcoat layer disposed on the source/drain electrode of the driving thin film transistor, the first electrode portion and the second electrode portion may be disposed to be connected to each other on the overcoat layer, a bank layer may be disposed on the first electrode portion and the second electrode portion, the light emitting layer may be disposed on the bank layer, and the common electrode may be disposed on the light emitting layer.

In the light emitting display device according to the aspect of the present disclosure, the first electrode portion and the second electrode portion may be made of the same material as that of the first and second pixel electrode portions and the circuit contact portion.

In the light emitting display device according to the aspect of the present disclosure, when a dark spot defect occurs in a light emitting element area corresponding to the first pixel electrode portion or the second pixel electrode portion, the second electrode portion, which is connected with a pixel electrode portion corresponding to the dark spot defect, may be disconnected or removed to electrically separate the corresponding pixel electrode portion from the pixel circuit.

An electronic apparatus according to an aspect of the present disclosure may include light emitting display device described above. For example, the electronic apparatus may be a personal computer, a smart phone or a television, but is not limited thereto.

According to the present disclosure, the following advantageous effects may be obtained.

The light emitting display device according to the present disclosure may embody a repair structure that may prevent all of subpixels from becoming dark spots by providing a divided structure inside the subpixels and electrically separating a defect area of the subpixels when the defect area that is not removed by the aging process occurs. Therefore, manufacturing yield of the light emitting display device may be enhanced, and manufacturing costs may be reduced.

It will be apparent to those skilled in the art that the present disclosure described above is not limited by the above-described aspects and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

What is claimed is:

1. A light emitting display device comprising:
a light emitting element including a pixel electrode, a common electrode and a light emitting layer interposed between the pixel electrode and the common electrode; and
a pixel circuit electrically connected to the pixel electrode of the light emitting element,
wherein the pixel electrode includes:
a first pixel electrode portion;
a second pixel electrode portion spaced apart from the first pixel electrode portion;
a circuit contact portion connected to the pixel circuit;
a first electrode connection portion disposed between the first pixel electrode portion and the circuit contact portion; and
a second electrode connection portion disposed between the second pixel electrode portion and the circuit contact portion.

2. The light emitting display device of claim 1, wherein the circuit contact portion and each of the first electrode connection portion and the second electrode connection portion are disposed between the first pixel electrode portion and the second pixel electrode portion.

3. The light emitting display device of claim 1, wherein resistance of the first electrode connection portion is higher than that of the first pixel electrode portion, and resistance of the second electrode connection portion is higher than that of the second pixel electrode portion.

4. The light emitting display device of claim 1, wherein a size of each of the first and second electrode connection portions is gradually reduced toward the circuit contact portion.

5. The light emitting display device of claim 1, wherein a length of the first electrode connection portion corresponds to a shortest distance between the first pixel electrode portion and the circuit contact portion, and a length of the second electrode connection portion corresponds to a shortest distance between the second pixel electrode portion and the circuit contact portion.

6. The light emitting display device of claim 1, further comprising:
a driving thin film transistor included in the pixel circuit; and
at least one insulating film disposed between the driving thin film transistor and the circuit contact portion,
wherein the circuit contact portion is electrically connected with a source/drain electrode of the driving thin film transistor through a contact hole in the at least one insulating film.

7. The light emitting display device of claim 6, wherein the first electrode connection portion includes a first electrode pattern extended from the first pixel electrode portion;
wherein the second electrode connection portion includes a first electrode pattern extended from the second pixel electrode portion; and
wherein each of the first and second electrode connection portions includes:
a second electrode pattern extended from the circuit contact portion;
a common electrode connection pattern spaced from and between the first electrode pattern and the second electrode pattern;
a first electrode connection pattern electrically connecting the first electrode pattern with the common electrode connection pattern; and
a second electrode connection pattern spaced apart from the first electrode connection pattern, electrically connecting the second electrode pattern with the common electrode connection pattern.

8. The light emitting display device of claim 7, wherein the first and second electrode connection patterns in each of the first and second electrode connection portions are spaced apart from each other on a same plane as the source/drain electrode of the driving thin film transistor,
an overcoat layer is disposed on the first and second electrode connection patterns,
first and second electrode patterns overlapping with the first and second electrode connection patterns are spaced apart from each other on the overcoat layer,
a bank layer is disposed on the first and second electrode patterns,
the light emitting layer is disposed on the bank layer, and
the common electrode and the common electrode connection pattern are disposed on the light emitting layer.

9. The light emitting display device of claim 8, wherein the first electrode pattern is electrically connected with the first electrode connection pattern through a first contact hole in the overcoat layer, and
the second electrode pattern is electrically connected with the second electrode connection pattern through a second contact hole in the overcoat layer.

10. The light emitting display device of claim 9, wherein the overcoat layer positioned between the first and second electrode patterns includes:
an overcoat pattern covering an end of each of the first and second electrode connection patterns; and
a through hole surrounding the overcoat pattern and exposing a lower portion of an end of each of the first and second electrode patterns and a portion of an upper surface of the first and second electrode connection patterns.

11. The light emitting display device of claim 10, wherein the bank layer includes:
a bank pattern disposed on the overcoat pattern to have a step difference; and
a bank hole surrounding the bank pattern and at least partially overlapping with the through hole of the overcoat layer.

12. The light emitting display device of claim 11, wherein the common electrode connection pattern is disposed on the overcoat pattern and the bank pattern and is in contact with the upper surface of the first and second electrode connection patterns, which is exposed through the through hole of the overcoat layer.

13. The light emitting display device of claim 12, wherein the first electrode pattern and the second electrode pattern are made of a same material as that of the first and second pixel electrode portions and the circuit contact portion,
the common electrode connection pattern is made of a same material as that of the common electrode, and
the first electrode connection pattern and the second electrode connection pattern are made of a same material as that of the source/drain electrode of the driving thin film transistor.

14. The light emitting display device of claim 13, wherein, when a dark spot defect occurs in a light emitting element area corresponding to the first pixel electrode portion or the second pixel electrode portion, at least a portion of the common electrode connection pattern, which is connected with a pixel electrode portion corresponding to the dark spot defect, is disconnected or removed to electrically separate the corresponding pixel electrode portion from the pixel circuit.

15. The light emitting display device of claim 6, wherein the first electrode connection portion includes:
a first electrode portion extended from the first or second pixel electrode portion; and
a second electrode portion extended from the circuit contact portion,
wherein the second electrode connection portion includes:
a first electrode portion extended from the second pixel electrode portion; and
a second electrode portion extended from the circuit contact portion,
wherein, for each of the first electrode connection portion and the second electrode connection portion, an area of the first electrode portion is larger than that of the second electrode portion.

16. The light emitting display device of claim 15, wherein for the first electrode connection portion, the first electrode portion has a first width in a portion that is in contact with the first pixel electrode portion, and has a second width, which is narrower than the first width, in a portion that is in contact with the circuit contact portion, and
wherein for the second electrode connection portion, the first electrode portion has a first width in a portion that is in contact with the second pixel electrode portion, and has a second width, which is narrower than the first width, in a portion that is in contact with the circuit contact portion.

17. The light emitting display device of claim 16, wherein for each of the first electrode connection portion and the second electrode connection portion, the second electrode portion has a third width that is equal to or narrower than the second width of the first electrode portion.

18. The light emitting display device of claim 17, wherein each of the first and second electrode connection portions includes an overcoat layer disposed on the source/drain electrode of the driving thin film transistor,
the first electrode portion and the second electrode portion are disposed to be connected to each other on the overcoat layer,
a bank layer is disposed on the first electrode portion and the second electrode portion,
the light emitting layer is disposed on the bank layer, and
the common electrode is disposed on the light emitting layer.

19. The light emitting display device of claim 18, wherein the first electrode portion and the second electrode portion are made of a same material as that of the first and second pixel electrode portions and the circuit contact portion.

20. The light emitting display device of claim 19, wherein, when a dark spot defect occurs in a light emitting element area corresponding to the first pixel electrode portion or the second pixel electrode portion, the second electrode portion, which is connected with a pixel electrode portion corresponding to the dark spot defect, is disconnected or removed to electrically separate the corresponding pixel electrode portion from the pixel circuit.

* * * * *